(12) United States Patent
Zaderej et al.

(10) Patent No.: US 10,149,409 B2
(45) Date of Patent: Dec. 4, 2018

(54) ENERGY CONSUMING DEVICE AND ASSEMBLY

(71) Applicant: Molex, LLC, Lisle, IL (US)

(72) Inventors: Victor Zaderej, Wheaton, IL (US); Daniel B. McGowan, Glen Ellyn, IL (US); Megan Serwacki, Oswego, IL (US)

(73) Assignee: Molex, LLC, Lisle, IL (US)

( * ) Notice: Subject to any disclaimer, the term of this patent is extended or adjusted under 35 U.S.C. 154(b) by 199 days.

(21) Appl. No.: 15/074,647

(22) Filed: Mar. 18, 2016

(65) Prior Publication Data

US 2016/0205799 A1   Jul. 14, 2016

Related U.S. Application Data

(63) Continuation of application No. 13/992,319, filed as application No. PCT/US2011/050178 on Sep. 1, 2011, now Pat. No. 9,301,416.

(Continued)

(51) Int. Cl.
*F21V 23/00* (2015.01)
*F21V 21/096* (2006.01)
(Continued)

(52) U.S. Cl.
CPC .............. *H05K 7/2039* (2013.01); *B60Q 3/53* (2017.02); *F21K 9/20* (2016.08); *F21S 2/005* (2013.01); *F21S 8/038* (2013.01); *F21V 15/01* (2013.01); *F21V 19/0015* (2013.01); *F21V 21/00* (2013.01); *F21V 21/096* (2013.01); *F21V 21/35* (2013.01); *F21V 23/008* (2013.01); *F21V 23/06* (2013.01); *F21V 29/004* (2013.01);
(Continued)

(58) Field of Classification Search
CPC .... B60Q 3/53; F21K 9/20; F21S 2/005; F21S 48/328; F21S 8/038; F21V 17/105; F21V 19/0015; F21V 21/096; F21V 21/35; F21V 29/70; F21V 29/713; F21Y 2115/10; H01R 13/6205
See application file for complete search history.

(56) References Cited

U.S. PATENT DOCUMENTS 5,154,509 A   10/1992   Wulfman et al.
6,964,510 B2  11/2005   Galli
(Continued)

FOREIGN PATENT DOCUMENTS

JP   2004-055229 A   2/2004
JP   2009-140669 A   6/2009
(Continued)

*Primary Examiner* — Peggy Neils
(74) *Attorney, Agent, or Firm* — Jeffrey K. Jacobs

(57) ABSTRACT

An energy consumption device includes a housing that supports a first and second terminal. An energy consuming module, which may include a light emitting diode array, is supported by the housing and is thermally coupled to a thermal bridge that extends below a lower surface of the housing. A cover can be positioned so as to secure the energy consuming module between the cover and the housing. A plurality of magnets can be configured to secure the energy consumption device to a rail that supports powered contacts so that the first and second terminals engage the powered contacts and the thermal bridge is pressed against the rail.

20 Claims, 19 Drawing Sheets

Related U.S. Application Data

(60) Provisional application No. 61/514,748, filed on Aug. 3, 2011, provisional application No. 61/485,470, filed on May 12, 2011, provisional application No. 61/423,392, filed on Dec. 15, 2010.

(51) Int. Cl.

| | | |
|---|---|---|
| *H05K 7/20* | (2006.01) | |
| *F21S 2/00* | (2016.01) | |
| *F21S 8/00* | (2006.01) | |
| *F21V 15/01* | (2006.01) | |
| *F21V 21/35* | (2006.01) | |
| *F21V 29/00* | (2015.01) | |
| *H01R 13/62* | (2006.01) | |
| *F21V 19/00* | (2006.01) | |
| *F21V 21/00* | (2006.01) | |
| *F21V 23/06* | (2006.01) | |
| *H05K 7/12* | (2006.01) | |
| *F21V 29/70* | (2015.01) | |
| *F21V 29/71* | (2015.01) | |
| *F21K 9/20* | (2016.01) | |
| *B60Q 3/53* | (2017.01) | |
| *F21V 17/10* | (2006.01) | |
| *F21W 131/301* | (2006.01) | |
| *H01R 25/14* | (2006.01) | |
| *F21Y 105/10* | (2016.01) | |
| *F21Y 115/10* | (2016.01) | |

(52) U.S. Cl.
CPC ............ *F21V 29/70* (2015.01); *F21V 29/713* (2015.01); *H01R 13/6205* (2013.01); *H05K 7/12* (2013.01); *F21V 17/105* (2013.01); *F21W 2131/301* (2013.01); *F21Y 2105/10* (2016.08); *F21Y 2115/10* (2016.08); *H01R 25/147* (2013.01); *Y10S 362/80* (2013.01)

(56) References Cited

U.S. PATENT DOCUMENTS

| | | | |
|---|---|---|---|
| 7,290,913 | B2 | 11/2007 | Watanabe et al. |
| 7,726,974 | B2 | 6/2010 | Shah et al. |
| 7,750,458 | B2 | 7/2010 | Takeda et al. |
| 7,828,557 | B2 | 11/2010 | Vogt et al. |
| 7,985,005 | B2 | 7/2011 | Alexander et al. |
| 8,184,445 | B2 | 5/2012 | Jacobs et al. |
| 8,342,733 | B2 | 1/2013 | Daily et al. |
| 8,371,728 | B2 | 2/2013 | Hente et al. |
| 8,651,711 | B2 * | 2/2014 | Rudisill ............... F21V 29/70 362/249.02 |
| 8,985,813 | B2 * | 3/2015 | Zaderej ............... F21S 2/005 362/249.02 |
| 9,301,416 | B2 * | 3/2016 | Zaderej ............... F21S 2/005 |
| 2006/0083012 | A1 | 4/2006 | Artak |
| 2007/0285949 | A1 | 12/2007 | Lodhie et al. |
| 2009/0086478 | A1 | 4/2009 | Sanroma et al. |
| 2009/0279298 | A1 | 11/2009 | Mier-Langner et al. |
| 2009/0284988 | A1 | 11/2009 | Snagel et al. |
| 2010/0135020 | A1 | 6/2010 | Moore |
| 2010/0271834 | A1 | 10/2010 | Muessli |
| 2010/0295070 | A1 | 11/2010 | Su et al. |

FOREIGN PATENT DOCUMENTS

| | | |
|---|---|---|
| JP | 2010-135126 A | 6/2010 |
| WO | WO 2008-003725 A1 | 1/2008 |

\* cited by examiner

ENERGY CONSUMING DEVICE AND ASSEMBLY

RELATED APPLICATIONS

This application is a continuation of U.S. application Ser. No. 13/992,319, filed Jun. 7, 2013, which is a national phase of and claims priority to PCT Application No. PCT/US11/50178, filed Sep. 1, 2011, which in turn claims priority to U.S. Provisional Application No. 61/423,392, filed Dec. 15, 2010, to U.S. Provisional Application No. 61/485,470, filed May 12, 2011, and U.S. Provisional Application No. 61/514,748, filed Aug. 3, 2011, all of which are incorporated herein by reference in their entirety.

FIELD OF THE INVENTION

The present invention particularly relates to relates to the field of energy consuming devices, more specifically to energy consuming devices that can be secured to a pair of contacts.

BACKGROUND OF THE INVENTION

Existing track lighting systems are configured to position a light emitting element in a particular location while providing electricity to that location. One of the benefits of such a system is that it is possible to position the light emitting elements in a number of locations along the track, thus providing a high level of customization. While these existing systems work well with incandescent light sources, new more efficient LED based light sources require more thermal control as LEDs are susceptible to reductions in useful life at elevated temperatures. In addition, conventional track lighting systems tended to be larger due to the size of incandescent bulb. Consequentially, a system that could address thermal, electrical and structure concerns in an easy to install manner that provides an elegant and aesthetic design would be appreciated by certain individuals.

SUMMARY OF THE INVENTION

An energy consumption device includes a housing that supports one or more magnets and a first and second terminal. An energy consuming module, which may include a light emitting diode array, is supported by the housing. A cover can be used to secure components to the housing. A thermal bridge that extends below a lower surface of the housing can be provided. The one or more magnets can be configured to secure the energy consumption device to a rail that supports powered contacts. The first and second terminals engage the powered contacts. The thermal bridge can be configured to be pressed against the rail so as to provide low thermal resistance between the energy consuming module and the rail.

BRIEF DESCRIPTION OF THE DRAWINGS

The present disclosure is illustrated by way of example and not limited in the accompanying figures in which like reference numerals indicate similar elements and in which.

DETAILED DESCRIPTION OF THE ILLUSTRATED EMBODIMENT

Figure 1:
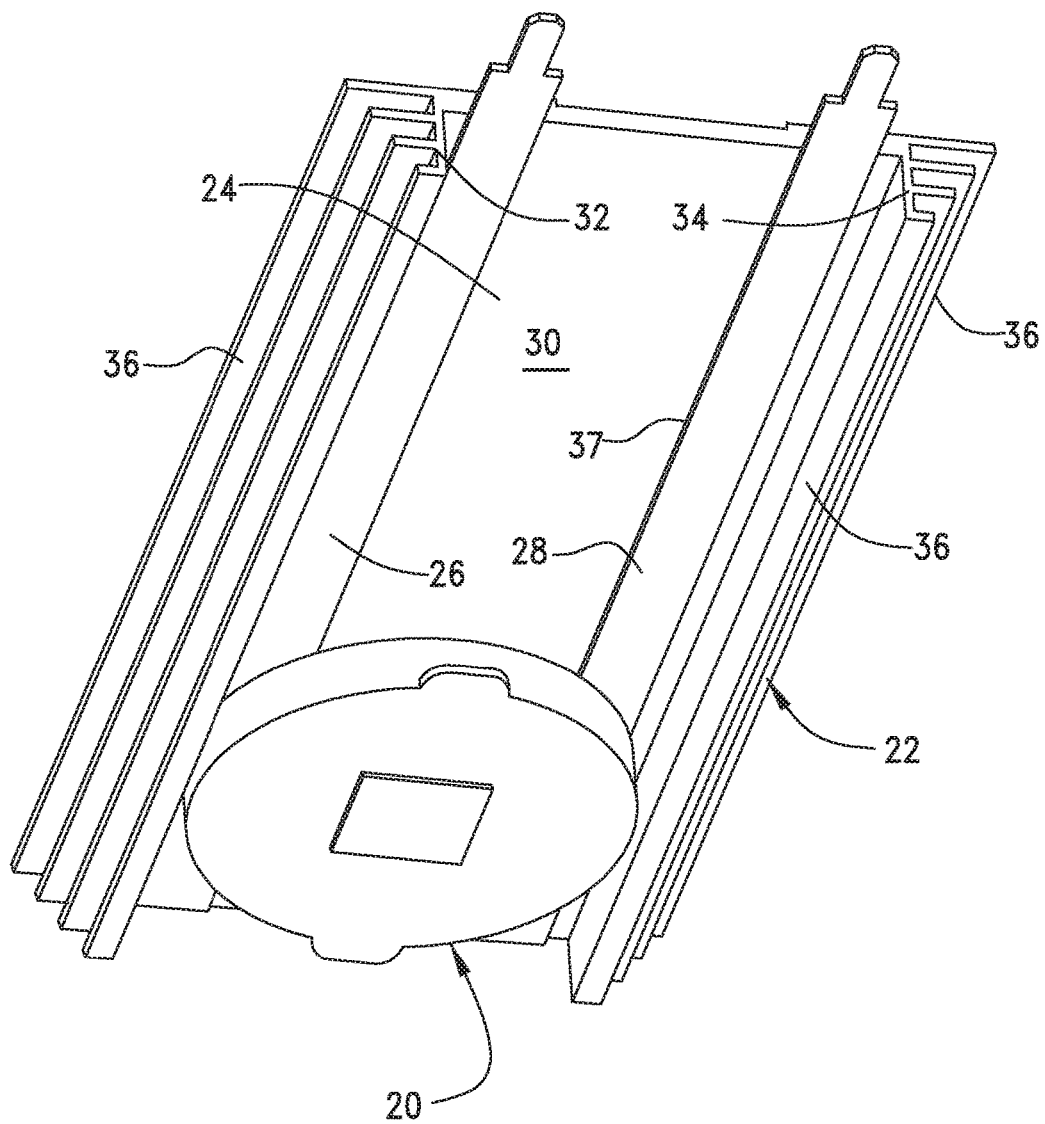
FIG. 1 is a perspective view of an embodiment of an energy consuming device, namely an LED device, and a support structure.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

In general, the depicted embodiments are intended for low voltage applications (such as 12-24 VAC/VDC). In certain applications the voltage will be DC (which makes it simple to power many types of components that require DC power). However, 12 VAC could also be provided. In such a scenario, the individual energy consuming devices would need to incorporate power conversion components such as rectifiers and capacitors and the like if they required DC power. In addition, as can be appreciated, multiple energy consuming devices may be placed on a single track in a manner that is discussed below. In addition, two tracks may be placed adjacent each other and first and second jumpers can couple the powered contacts on the two tracks together electrically. Naturally, a jumper can also provide power to a track if it is coupled to a separate power conversion unit (such as a power supply).

An energy consuming assembly includes an energy consuming device 20 is supported on a support structure 22 by magnetic force. A power supply module 120, which is depicted as being attached by magnetic force, can also be provided, however the power supply module can be attached to the support structure in any desired fashion. If more than one support structure 22 is desired to be used in the energy consuming assembly, a jumper 320 can also be supported on the support structure 22 by magnetic force to connect one support structure 22 to an adjacent support structure (not shown). The energy consuming device 20 may be an LED device. As can be appreciated, the depicted embodiments are suitable for use in track light applications as the energy consuming device 20 is simple to position and install, and move around along the support structure 22. The energy consuming device 20 and support structure 22 can be used in a number of applications, such as, for example but without limitation, under cabinet lighting, in vehicles and for plants. The depicted embodiments are also suitable for use in many other applications such as more general illumination and are believed to be particular suited to applications where flexibility is desirable.

The support structure 22 may take a number of shapes, such as straight (as shown), curved, wavy, stepped and the like. As shown, the support structure 22 is formed of a rail 24, which is shown as elongated in the drawings, which has a pair of spaced apart elongated powered contacts 26, 28 extending along the length thereof. The support structure 22 can be easily mounted onto a support surface, such as a wall, ceiling, cabinet and the like. It should be noted, however, that the support surface could be any desirable shape and could even be configured to be a socket-like shape or some other configuration that allowed a single energy consumer device to be mounted thereon. Furthermore, the support surface could be recessed in a housing if desired (it being understood that heat sink benefits provided by the rail might need to be provided by other structures).

As shown, the rail 24 is formed of a base wall 30 (which is depicted as being planar), and side walls 32, 34 which extend perpendicularly from the opposite edges of the base wall 30. A plurality of fins 36 extend outwardly from the side walls 32, 34. The rail 24 is thermally conductive and may also be electrically conductive and if electrically conductive, the pair of elongated powered contacts 26, 28 are electrically separated from the rail 24 via a suitable insulator 37, such as non-conductive double-sided tape, paint or anodizing provided on the rail 24. The rail 24 may be formed by extruded plastic which has been plated (for example plated with nickel and tin), may be formed completely of metal or could be a hybrid combination of plastic and metal pieces. While the side walls 32, 34 are shown as perpendicular to the base wall 30, it is to be understood that in certain embodiments the side walls 32, 34 can be eliminated, or can be angled at other angles relative to the base wall 30.

The energy consuming device 20 seats on the base wall 30 and on the powered contacts 26, 28. The rail 24 can act as a heat sink for the energy consuming device 20 as described herein.

The energy consuming device 20 includes a housing 38, which may be formed of a dielectric material, an energy consuming module 40 supported by the housing 38, a pair of magnets 42a, 42b supported by the housing 38, and a pair of terminals 62a, 62b supported by the housing 38. The energy consuming module 40 can include an LED array (which can be one or more LEDs provided in a desired pattern) if illumination is desired but could also be other energy consuming devices such as, without limitation, a wireless radio, a camera, a sensor and the energy consuming device may also project images or sound as desired through the inclusion of appropriate elements such as a speaker or image projector. A cover 46, which may be decorative, is positioned on the housing 38 and covers the energy consuming module 40 and the magnets 42a, 42b. A lens or other light-shaping elements 48, as are commonly known in the art, may be provided and can be supported by the housing 38 and/or by the cover 46 so as to direct the light from the energy consuming module 40 (if configured as an LED array).

Figure 2:
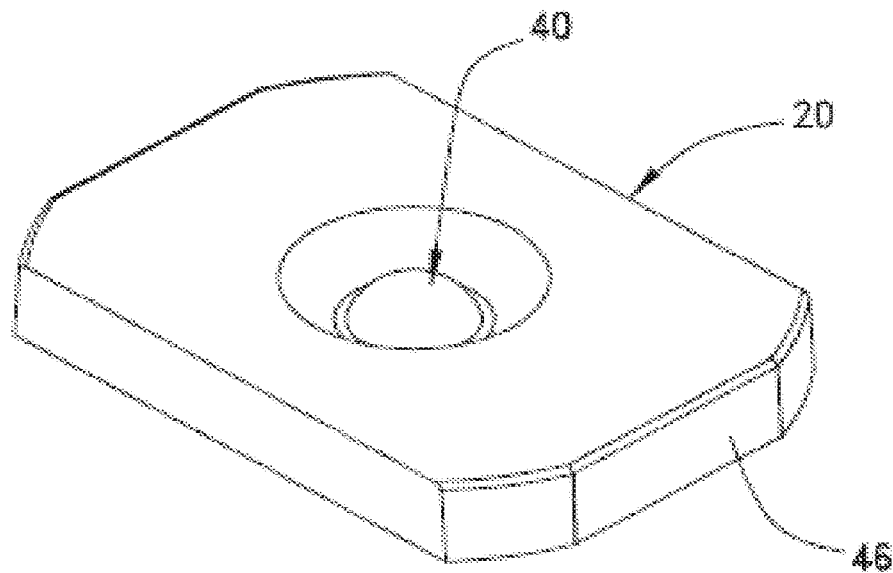
FIG. 2 is a perspective view of the energy consuming device.
Figure 3:
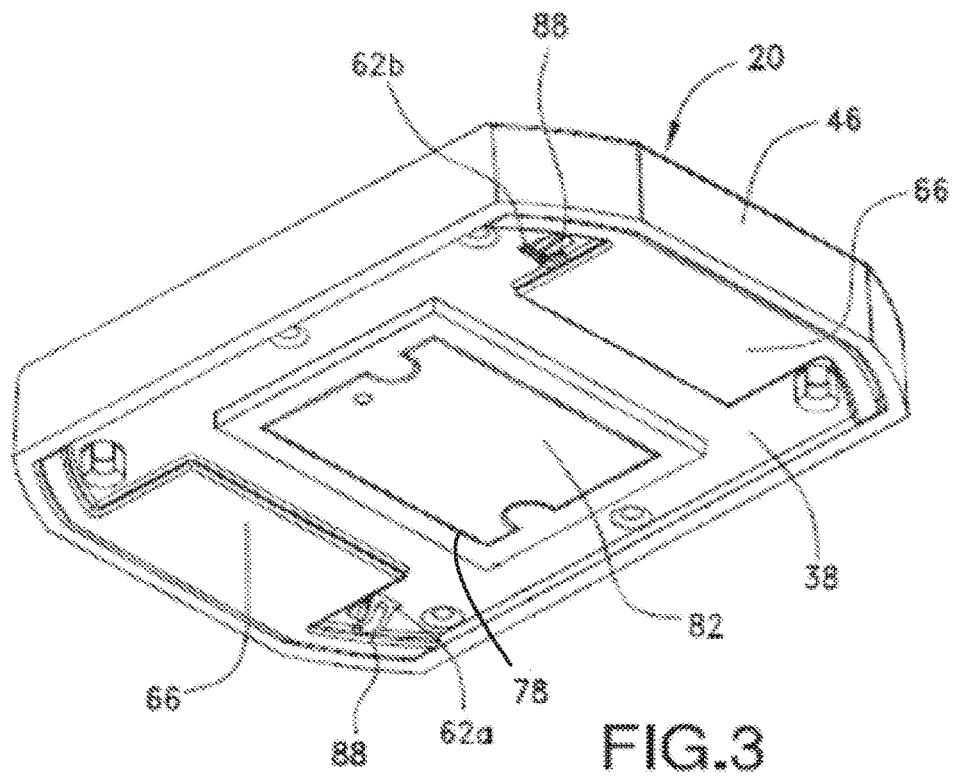
FIG. 3 is an alternate perspective view of the energy consuming device.
Figure 4:
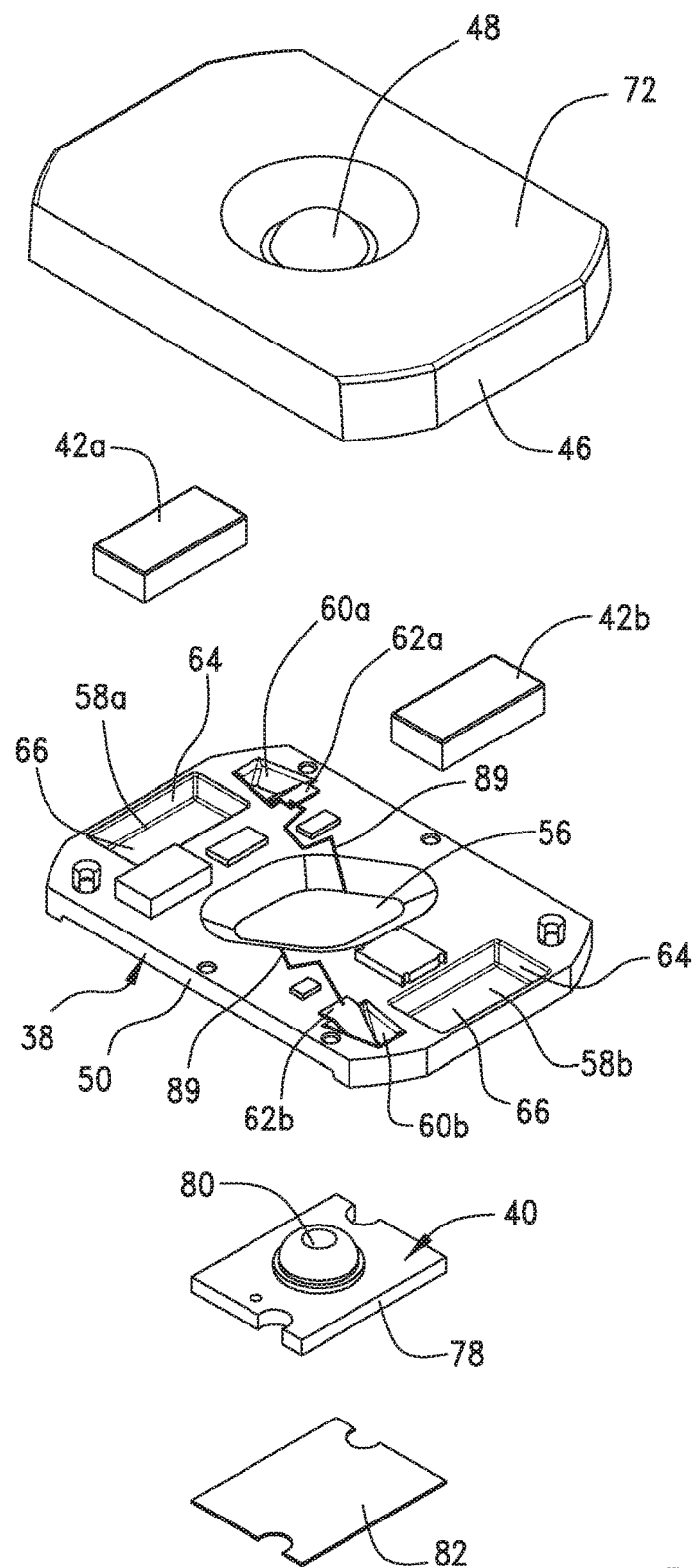
FIG. 4 is an exploded perspective view of the energy consuming device.
Figure 5:
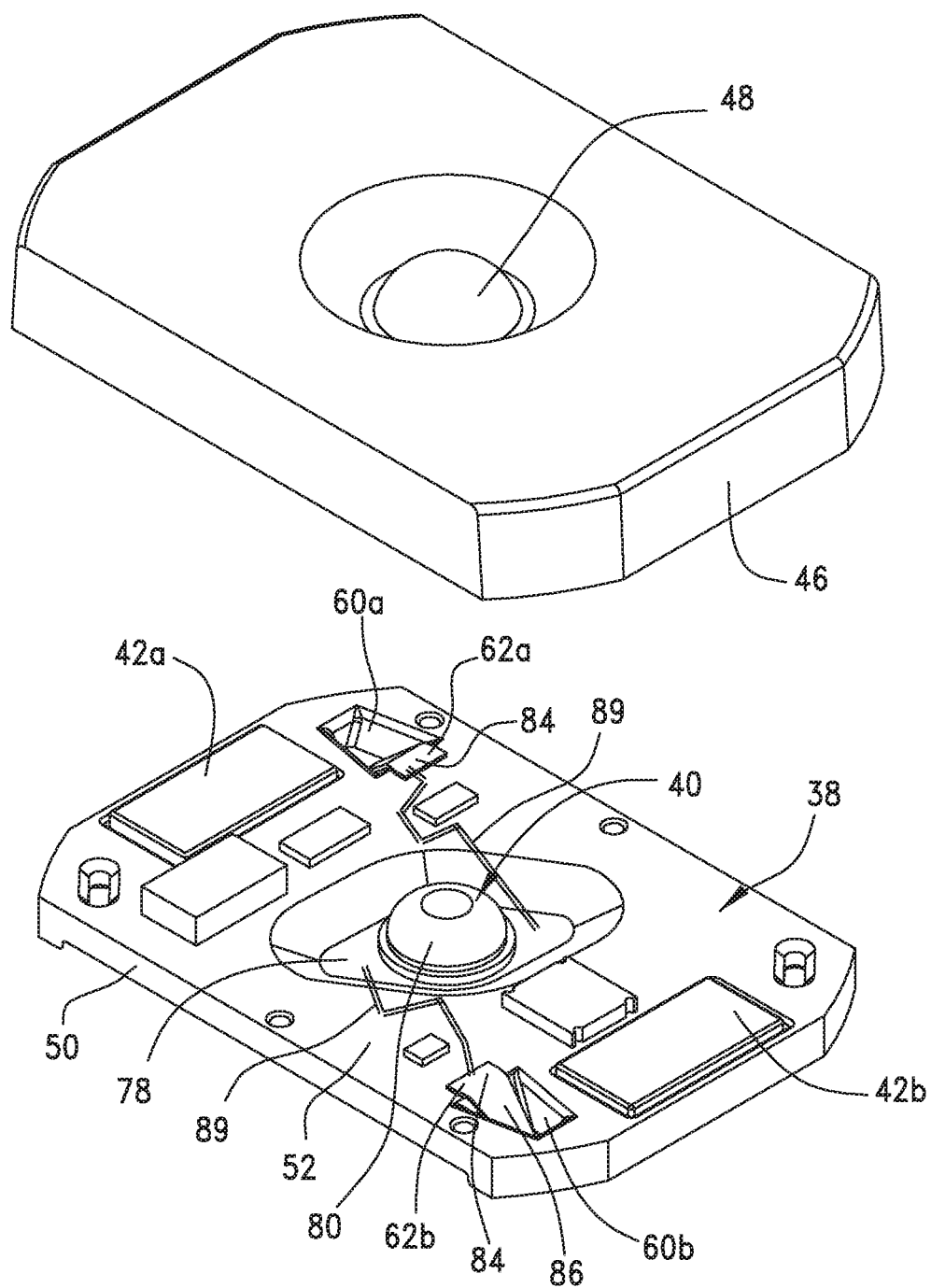
FIG. 5 is a partially exploded perspective view of the energy consuming device.
Figure 6:
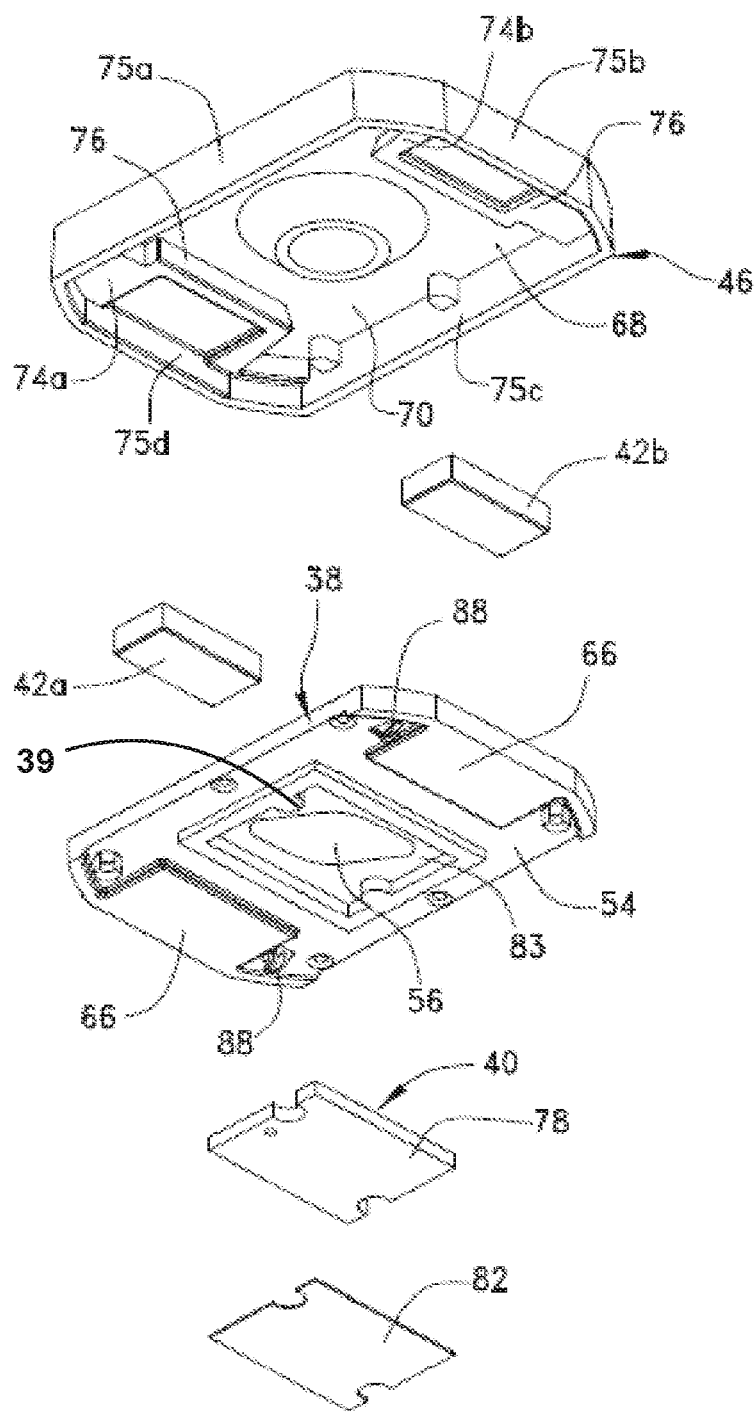
FIG. 6 is an alternate exploded perspective view of the energy consuming device.
Figure 7:
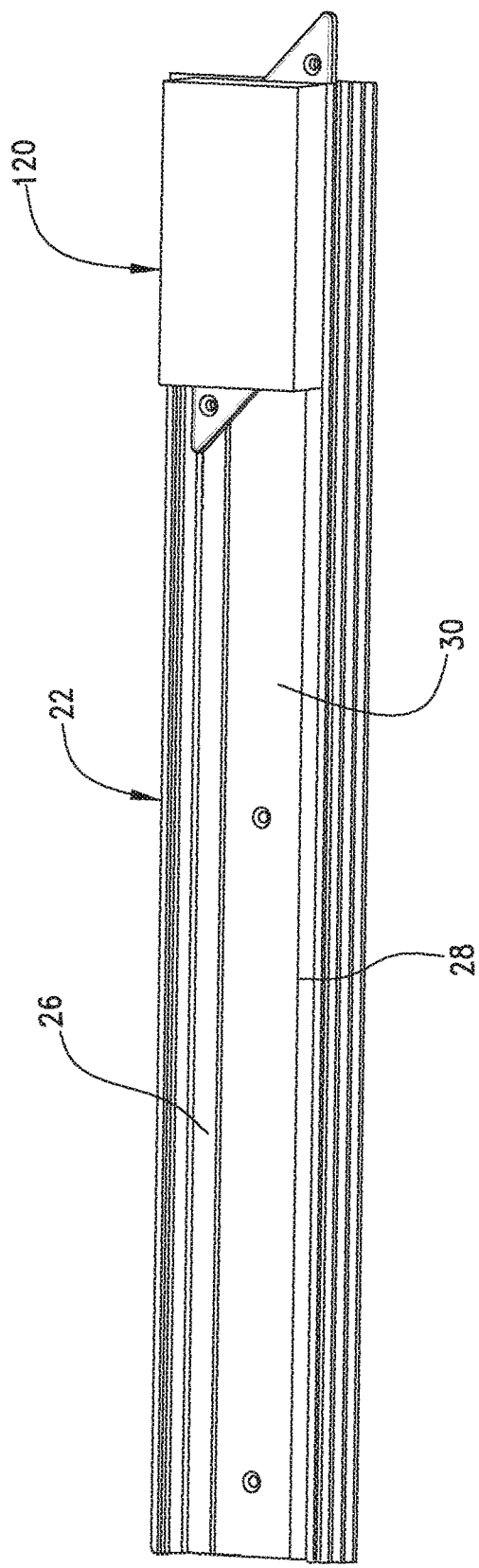
FIG. 7 is a perspective view of a embodiment of a power supply module mounted on the support structure.
Figure 8:
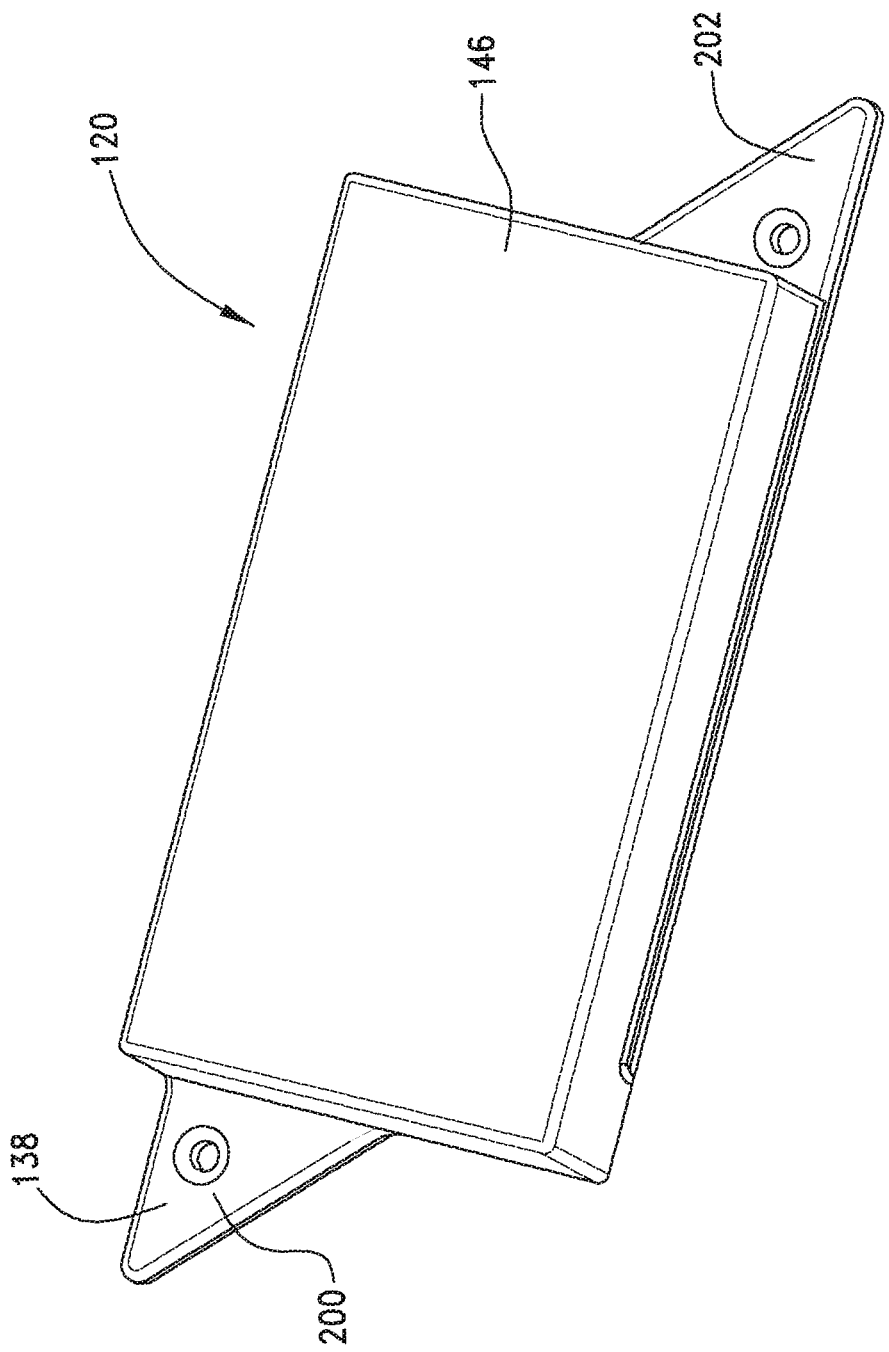
FIG. 8 is a perspective view of the power supply module.
Figure 9:
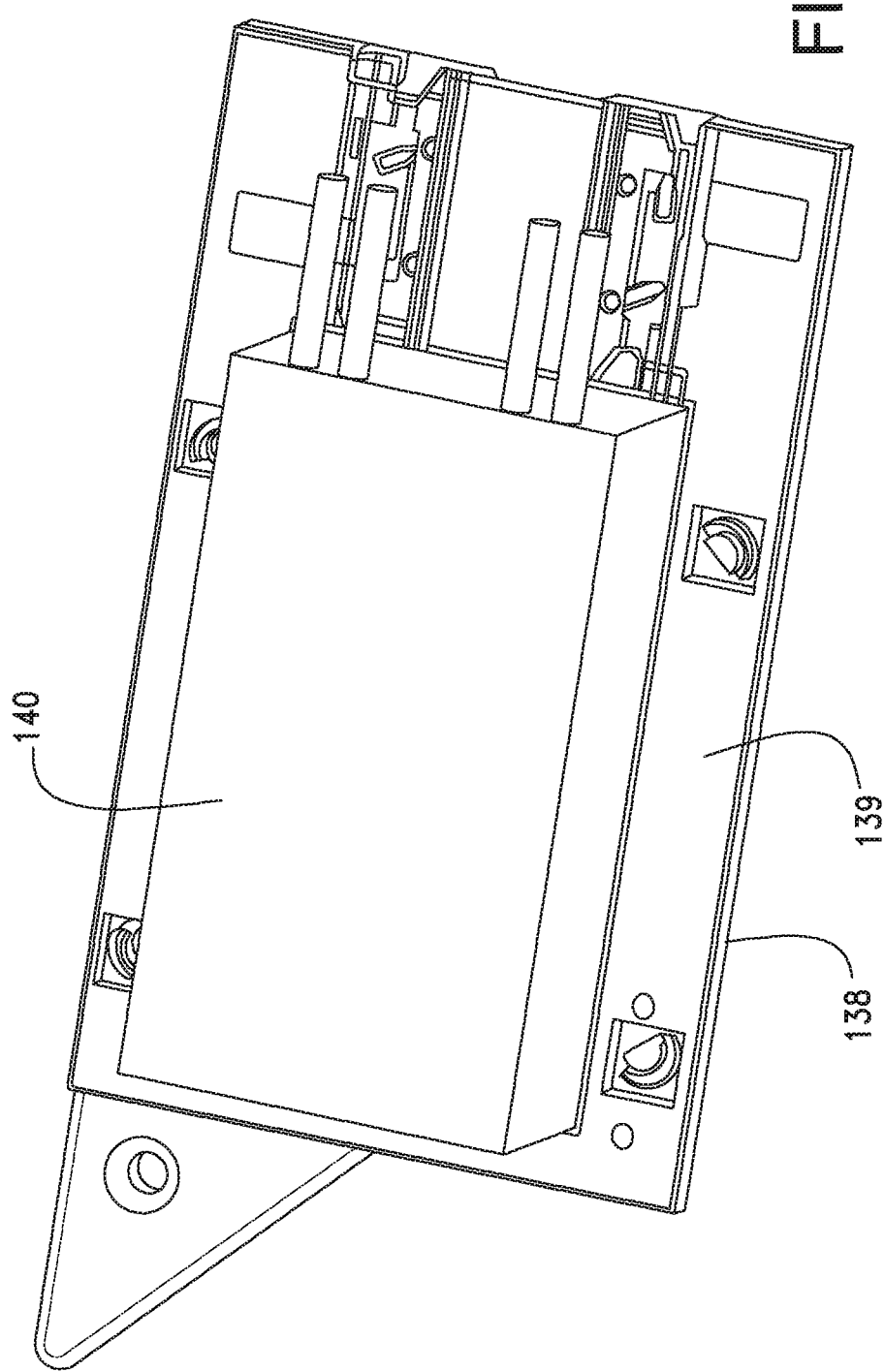
FIG. 9 is a perspective view of the power supply module with the cover removed.
Figure 10:
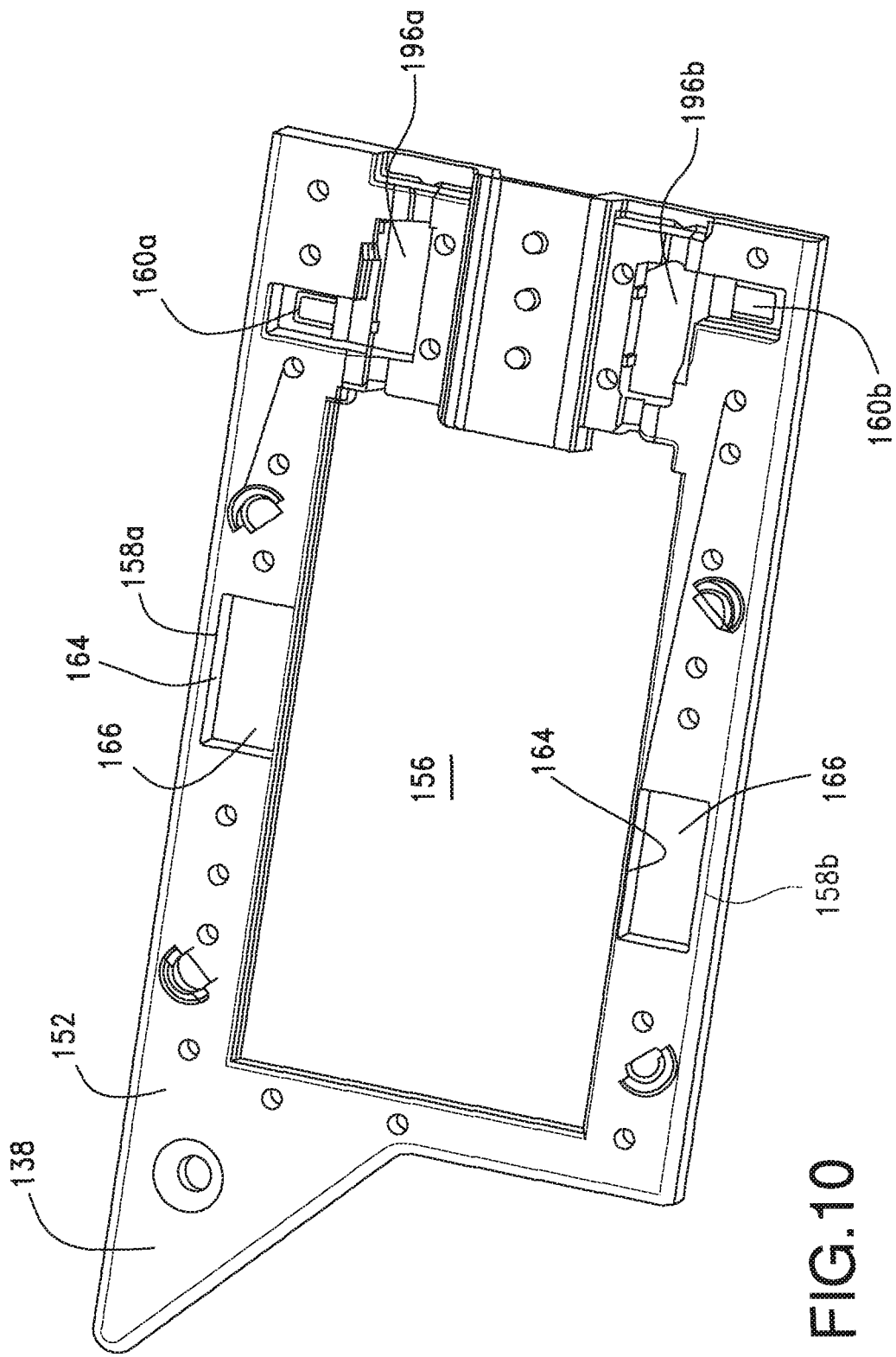
FIG. 10 is a perspective view of components of the power supply module.
Figure 11:
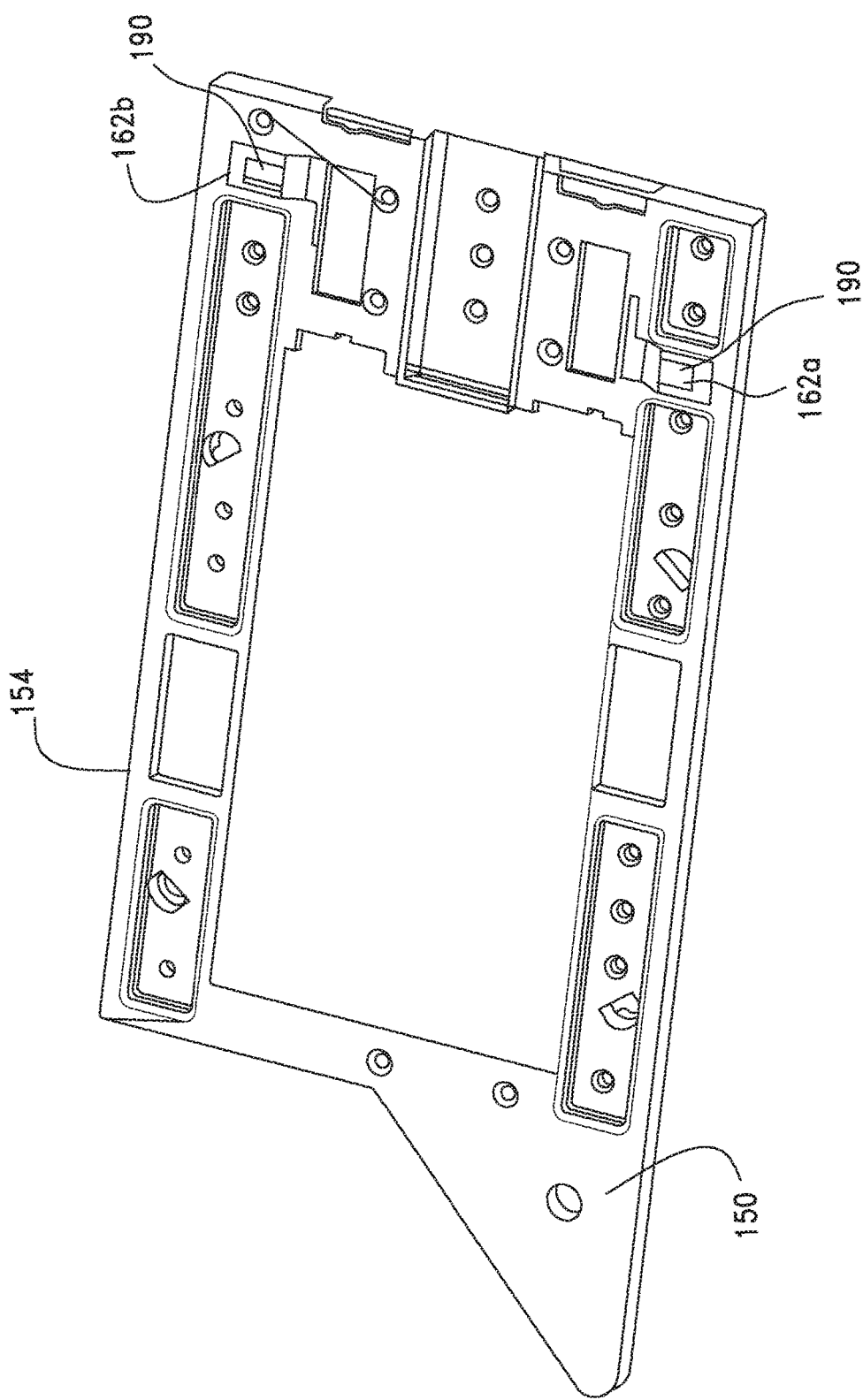
FIG. 11 is a perspective view of components of the power supply module.
Figure 12:
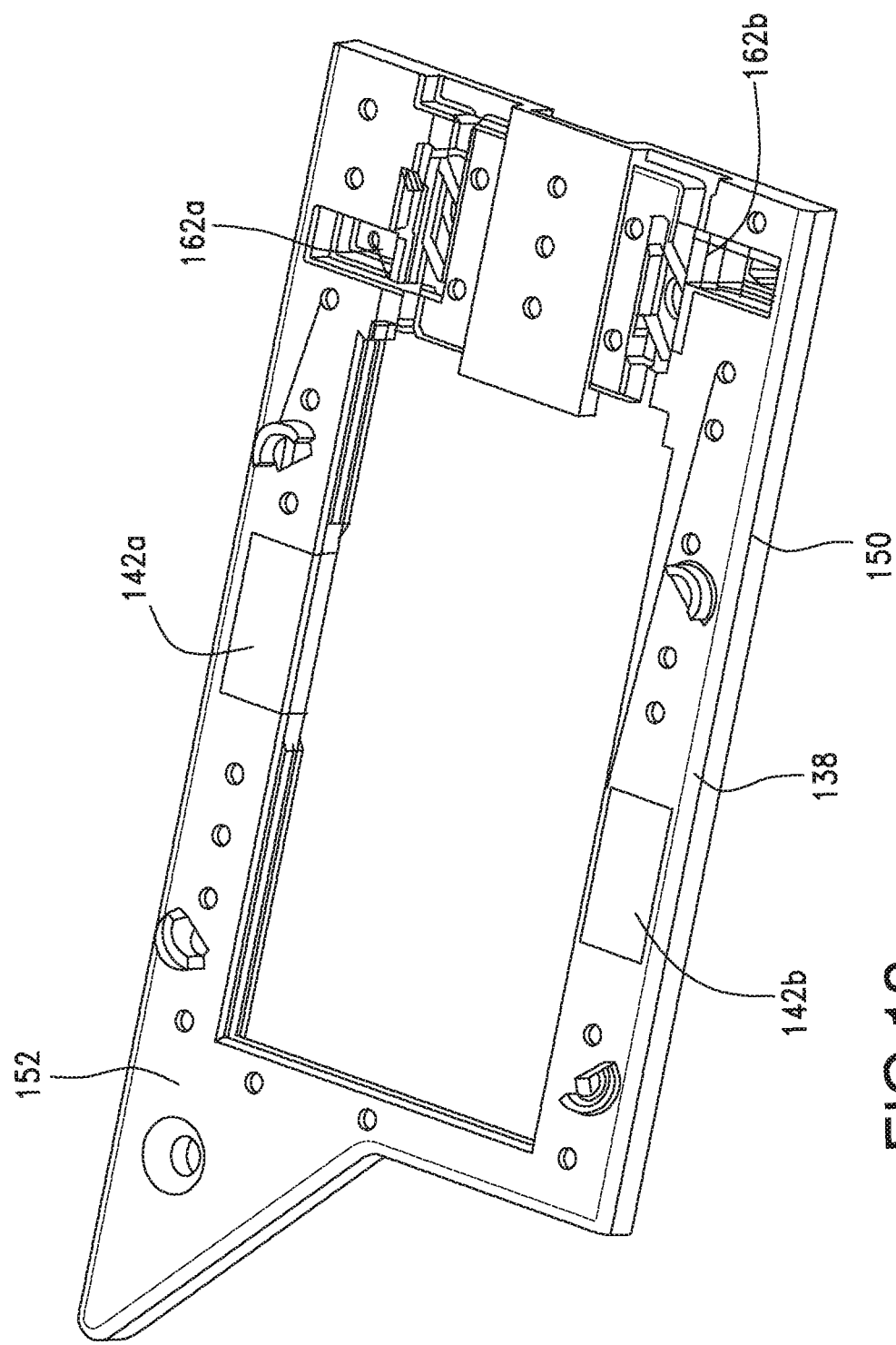
FIG. 12 is a perspective view of components of the power supply module.
Figure 13:
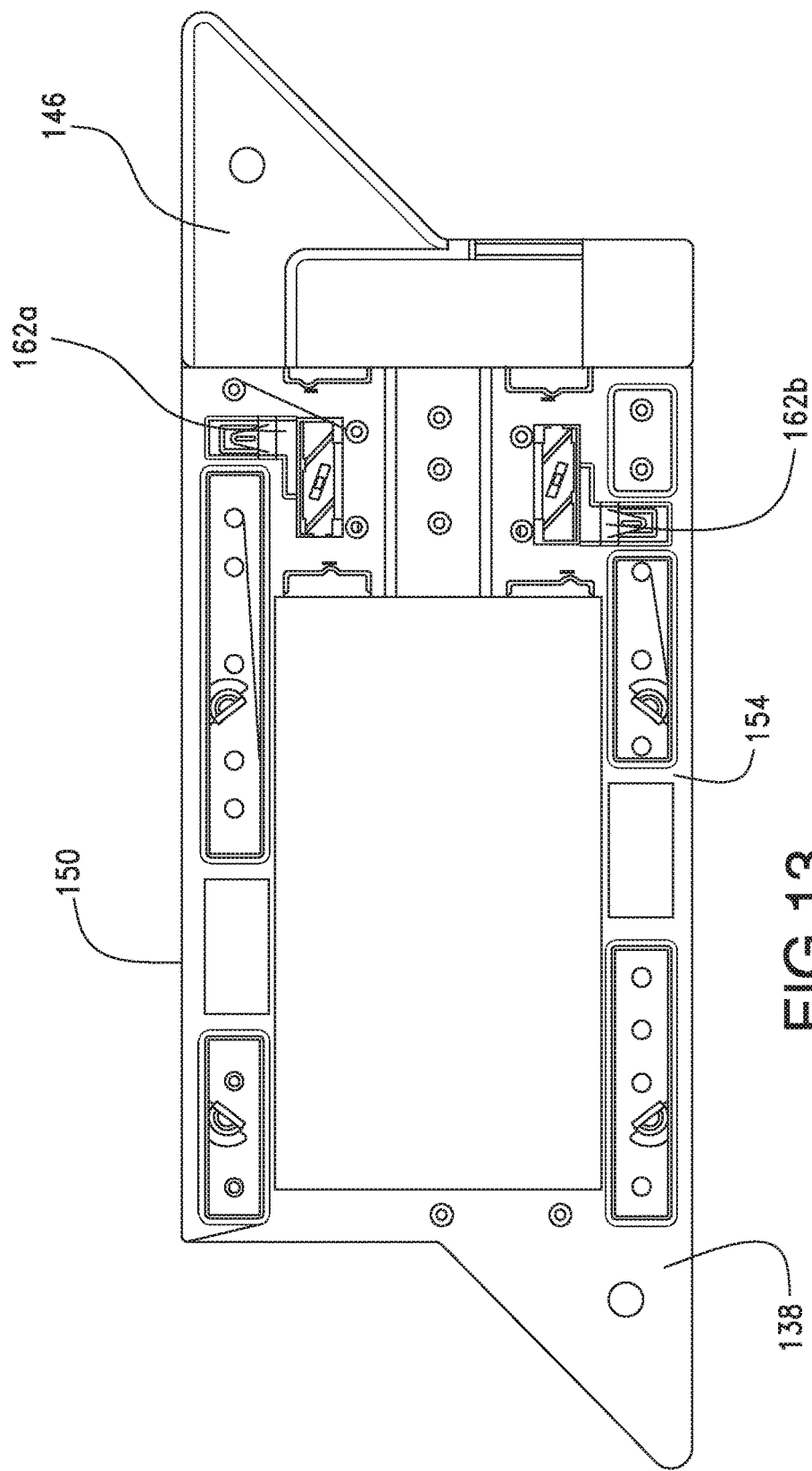
FIG. 13 is a top plan view of components of the power supply module.

The housing 38 may take a variety of shapes, for example circular as shown in FIG. 1, rectangular as shown in FIG. 2, square, triangular, oval-shaped, etc. The housing 38 includes a base 50 having internal and external surfaces 52, 54, an aperture 56 with an orientation feature 39, the aperture extending through the base 50, a magnet mount 58a, 58b provided at each end of the base 50 and spaced from the central aperture 56, and first and second terminal apertures 60a, 60b and their associated terminals 62a, 62b. It should be noted that while dual magnet mounts are depicted, in an embodiment the housing could be configured in alternative ways so that a single magnet mount was provided. For example, without limitation, one end of the housing could be retained via a lip provided by the support structure and then a single magnet mount and associated magnet would be sufficient to secure the housing into position. Alternatively, a magnet mount could be located in a central position on the housing such that the force was evenly distributed to the two terminals (and the thermal bridge—if included). A portion of the energy consuming module 40 extends through the aperture 56 through the base 50.

Magnet 42a seats in magnet mount 58a; magnet 42b seats in magnet mount 58b. As shown, magnets 42a, 42b are rectangular in cross-section so as to beneficially provide an easy to manufacture component, however, other shapes for the magnets 42a, 42b are also contemplated as numerous magnet shapes are known. Each magnet mount 58a, 58b is formed as a recess extending from the interior surface 52. Each magnet mount 58a, 58b has side walls 64 extending from the interior surface 52 and an interface wall 66. Each magnet mount 58a, 58b preferably conforms to the shape of the magnet 42a, 42b, and the magnets 42a, 42 may extend from the interior surface 52 of the housing 38 as shown, or may be flush with the interior surface 52 of the housing 38.

The cover 46 can take a variety of shapes to accommodate the energy consuming module 40 and the optional optic 48. For example, but without limitation, the cover 46 could be completely planar, the cover 46 could be substantially planar with a raised central portion to accommodate optics, and the cover could be concave or convex. The depicted cover 46 includes a cover wall 68 having an internal surface 70 and an external surface 72, an aperture through the center of the cover wall 68 in which the lens or other light-shaping elements 48 is mounted, a magnet mount 74a, 74b provided at each end of the cover wall 68 and spaced from the central aperture, and side walls 75a, 75b, 75c, 75d extending from the edges of the cover wall 68.

When the cover 46 is seated on the housing 38, magnet 42a is retained in magnet mount 74a; magnet 42b is retained in magnet mount 74b; and side walls 75a, 75b, 75c, 75d mate with the edges of the housing 38. Each magnet mount 74a, 74b has side walls 76 extending from the interior surface 70, with the interior surface 70 forming the base walls of the recesses. A portion of side walls 75b, 75d form part of the respective magnet mounts 74a, 74b. As can be appreciated, however, while the walls 75b, 75b of the cover 46 are shown as part of the magnet mounts 58a, 58b, separate walls can be provided on the cover 46 to form the remaining portion of the magnet mounts 58a, 58b. Each magnet mount 74a, 74b preferably conforms to the shape of the magnet 42a, 42b. As can be appreciated, therefore, the magnets 42a, 42b are sandwiched between interior surface 70 and interface walls 66, and thus are held in position. Additional constraint is provided by the walls 76, 75b, 75d, however, any desirable manner of restraint would be appropriate. For example, the magnets could be attached with adhesive or other fastening systems. The benefit of retaining the magnet between the housing and the cover is that manufacturing costs can be avoided.

As shown, the energy consuming module 40 is configured as a solid state lighting element that includes a plate 78 upon which the LED array seats and is protected by a cover 80. The plate 78 can be a thermally conductive material such as aluminum covered with an insulative layer upon which the LED array is placed. Alternatively, if the energy consuming module 40 is less sensitive to thermal degradation then the plate 78 can be a circuit board or some other composite structure. A thermal bridge 82 (which can be, without limitation, a thermal pad or thermal paste) can be provided on the external surface of the energy consuming module 40 (e.g., on a lower surface of the plate 78). The thermal bridge 82 can be a thermally conductive adhesive gasket such as, for example, 3M's Thermally Conductive Adhesive Transfer Tape 8810. As depicted, the thermal bridge 82 couples the plate 78 to base wall 30. In the depicted embodiment, as the plate 78 is configured to have a low thermal resistance between the plate 78 and the LED array (preferably the plate will have thermal conductivity of greater than 50 watts/meter-Kelvin (W/(m K)) and more preferably will have a thermal conductivity of greater than 100 W/(m K) and the thermal bridge 82 efficiently couples the plate 78 to the base wall 30, the total thermal resistance between the led array and the base wall 30 can be less than 3 C/W and preferably is less than 2 C/W. In addition, if the thermal bridge is kept thin and a material with a relatively high thermal conductivity is selected, it is possible to have less than 1 C/W. Such a design is possible, for example, with the BRIDGELUX led arrays in combination with suitable thermal bridge and sufficient force applied by the magnets. As can be appreciated, therefore, the depicted design in general allows for a magnetically supported energy consuming device 20 that has a very efficient thermal transfer design and as depicted, allows for a illumination device that produces more than 500 lumens while providing a very compact interface that has a thermal resistance of less than 3 C/W and preferably less than 2 C/W and potentially less than 1 C/W. The plate 78 seats within a recess 83 which surrounds the central aperture 56 such that the plate 78 is generally flush with the lowermost exterior surface of the housing 38.

Terminal aperture 60a is proximate to, but spaced from, magnet mount 58a; terminal aperture 60b is proximate to, but spaced from, magnet mount 58b. Terminal aperture 60a is adjacent to one edge of the base 50, while terminal aperture 60a is adjacent to the opposite edge of the base 50. Each terminal aperture 60a, 60b extends through the base 50, from the interior surface 52 to the exterior surface 54.

Figure 21:
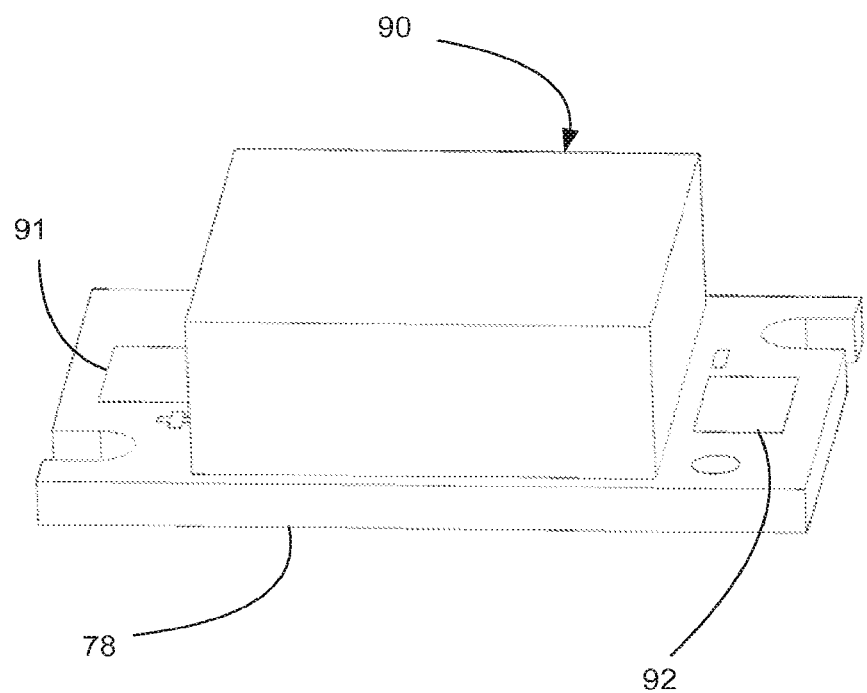
FIG. 21 is a perspective view of an embodiment of a light emitting diode (LED) array.

Each terminal 62a, 62b is formed of a conductive material and has first, second and third portions 84, 86, 88. The first portion 84 of each terminal 62a, 62b seats on and is mated to the interior surface 52 of the base 50 proximate to the respective terminal aperture 60a, 60b. The second portion 86 extends from the respective first portion 84 and is angled relative to the respective first portion 84. Each second portion 86 extends through the respective terminal aperture 60a, 60b. The third portion 88 extends from the respective second portion 86 and is configured to engage a power contact. Each third portion 88 is curved and extends outwardly from the exterior surface 54. The second and third portions 86, 88 can flex relative to the first portion 84 so that the third portion can suitably engage a power contact over a range of distances of flex. In an embodiment, the second and third portions 86, 88 have at least a 0.4 mm tolerance for the flexure range. The terminals 62a, 62b are electrically coupled to the energy consuming module 40, such as an anode 91 or cathode 92 of an LED array 90 (see FIG. 21) positioned on the plate 78, through the mount to the base 50 (for example solder) and via traces 89 provided on or in the housing 38. In an embodiment, a cover and a base can be configured so that a pocket is formed around the second and third portions of the terminals. In such an embodiment, water or dust that enters through the aperture is blocked from traveling further into the assembly by the fact that the housing and cover form a sealed beam therebetween. In one embodiment, this can be accomplished by closely managing tolerances between the housing and the cover. In another embodiment, the seal can be provided with the use of a gasket. One advantage of pressing the cover against the base so that the terminal is sandwiched between the cover and the housing is that the force provides further support for securing the first portion of the terminal in place, making any stress placed on the first portion less likely to cause harm to the joint between the energy consuming base and the terminal.

The energy consuming device 20 is placed on the support structure 22 such that the magnets 42a, 42b are between the powered contacts 26, 28 and are proximate to the base wall 30 of the rail 24. The magnetic attraction between the magnets 42a, 42b and the rail 24 provide a force that secures the energy consuming device 20 to the rail 24. The interface walls 66 are sufficiently thin so as not to interfere with the magnetic force. If desired, an aperture can be provided through each interface wall 66 to permit so as to allow a magnet to partially extend through the interface wall. In general, however, the interface wall can be configured so that such an aperture is not required. The thermal bridge 82 is positioned on the base wall 30 between the powered contacts 26, 28 and fills any space between the plate 78 and the base wall 30. This ensures a low thermal resistance between the plate 78 and the base wall 30. Depending on the dimensions of the device 20, an air gap may be provided between the interface walls 66 and the rail 24 so long as the air gap does not negatively impact the magnetic force.

Terminal 62a mates with powered contact 26; terminal 62b mates with powered contact 28. The second and third portions 86, 88 can flex within their tolerances relative to the first portions 84 upon engagement of the terminals 62a, 62b with the powered contacts 26, 28. This ensures a good electrical contact between the terminals 62a, 62b and the powered contacts 26, 28.

During operation, power flows through the powered contacts 26, 28, through the terminals 62a, 62b, along the traces, and to the energy consuming module 40. The energy consuming module 40 generates heat which typically must be removed (or the life of the energy consuming device will be reduced). The heat generated by the energy consuming module 40 transmits through the thermal bridge 82 to the base wall 30. The rail 24 acts as a heat sink. The fins 36 are not required, but serve to provide additional surface area for heat dissipation. Naturally, the rail (and optional fins) can be any desired shape that provides the appropriate ornamental design.

The energy consuming device 20 can be readily moved around on the support structure 22 by a user pulling the energy consuming device 20 away from the support structure 22 to overcome the magnetic force. The energy consuming device 20 can then be easily repositioned on the support structure 22.

If the thermal bridge 82 is provided on the energy consuming device 20, then sufficient force to ensure a reliable thermal connection between the energy consuming device 20 and the support structure 22 is desired. The magnets 42a, 42b provide such a force while avoiding the need to translate (e.g., rotate or slide) the energy consuming device 20 during installation (which can be advantageous if the thermal bridge 82 is compliant, has an adhesive nature or could be deformed during such translation). In the depicted embodiment a minimum of 3 psi (0.021 MPa), preferably 5 psi (0.034 MPa) and more preferably 10 psi (0.069 MPa) of pressure provided by the attraction between the magnets 42a, 42b and the rail 24 is beneficial to provide a reliable thermal connection. The level of force that is beneficial, however, will depend on the mass of the energy consuming device 20, the amount of thermal energy that needs to be removed, and the efficiency of the heat sink to which the energy consuming device is attached.

As shown in FIGS. 7-15, the power supply module 120 seats on the planar base wall 30 and on the powered contacts 26, 28. The power supply module 120 includes a lower dielectric housing 138, an upper dielectric housing 139, a power supply 140 supported by the lower housing 138 and extending through the upper housing 139, a pair of magnets 142a, 142b supported between the lower and upper housings 138, 139, and a pair of terminals 162a, 162b supported by the housing 138. A dielectric cover 146 is positioned on the housings 138, 139 and covers the power supply 140, the magnets 142a, 142b and the pair of terminals 162a, 162b.

The upper housing 138 includes a generally planar base wall 150 having internal and external surfaces 152, 154, a magnet mount 158a, 158b provided on opposite sides of the base wall 150, and first and second terminal apertures 160a, 160b and their associated terminals 162a, 162b. The power supply 140 seats within a recess 156 in the base 50.

Magnet 142a seats in magnet mount 158a; magnet 142b seats in magnet mount 158b. As shown, magnets 142a, 142b are preferably rectangular in cross-section for the purposes of being easily manufactured; however, other shapes for the magnets 142a, 142b are also contemplated and unless otherwise noted the shape is not intended to be limiting. Each magnet mount 158a, 158b is formed as a recess extending from the interior surface 152. Each magnet mount 158a, 158b has side walls 164 extending from the interior surface 152 and a planar base wall 166. Each magnet mount 158a, 158b preferably conforms to the shape of the magnet 142a, 142b, and the magnets 142a, 142 may extend from the interior surface 152 of the lower housing 138 as shown, or may be flush with the interior surface 152 of the lower housing 138.

Terminal aperture 160a is proximate to, but spaced from, magnet mount 158a; terminal aperture 160b is proximate to, but spaced from, magnet mount 158b. Terminal aperture 160a is adjacent to one side edge of the base wall 150, while terminal aperture 160b is adjacent to the opposite side edge of the base wall 150. Each terminal aperture 160a, 160b extends through the base wall 150, from the interior surface 152 to the exterior surface 154.

Figure 14:
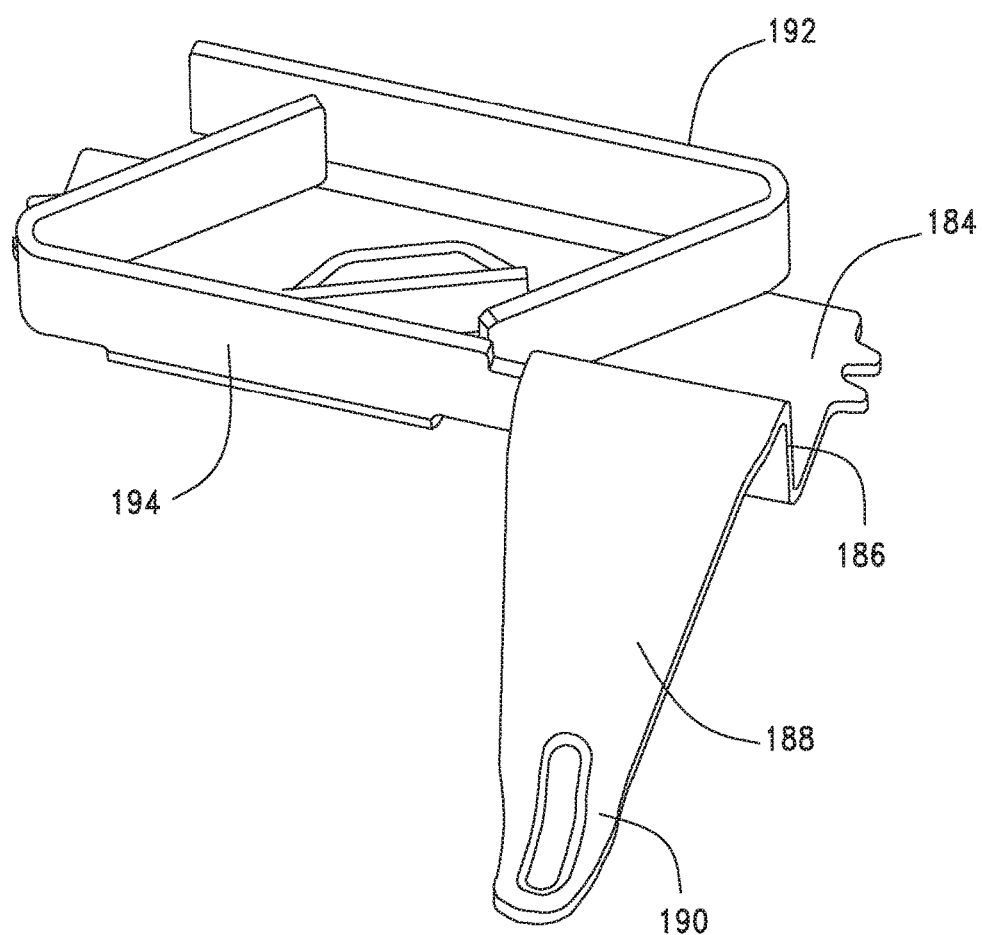
FIG. 14 is a perspective view of a contact used in the power supply module and the jumper shown in FIGS. 16-18.
Figure 15:
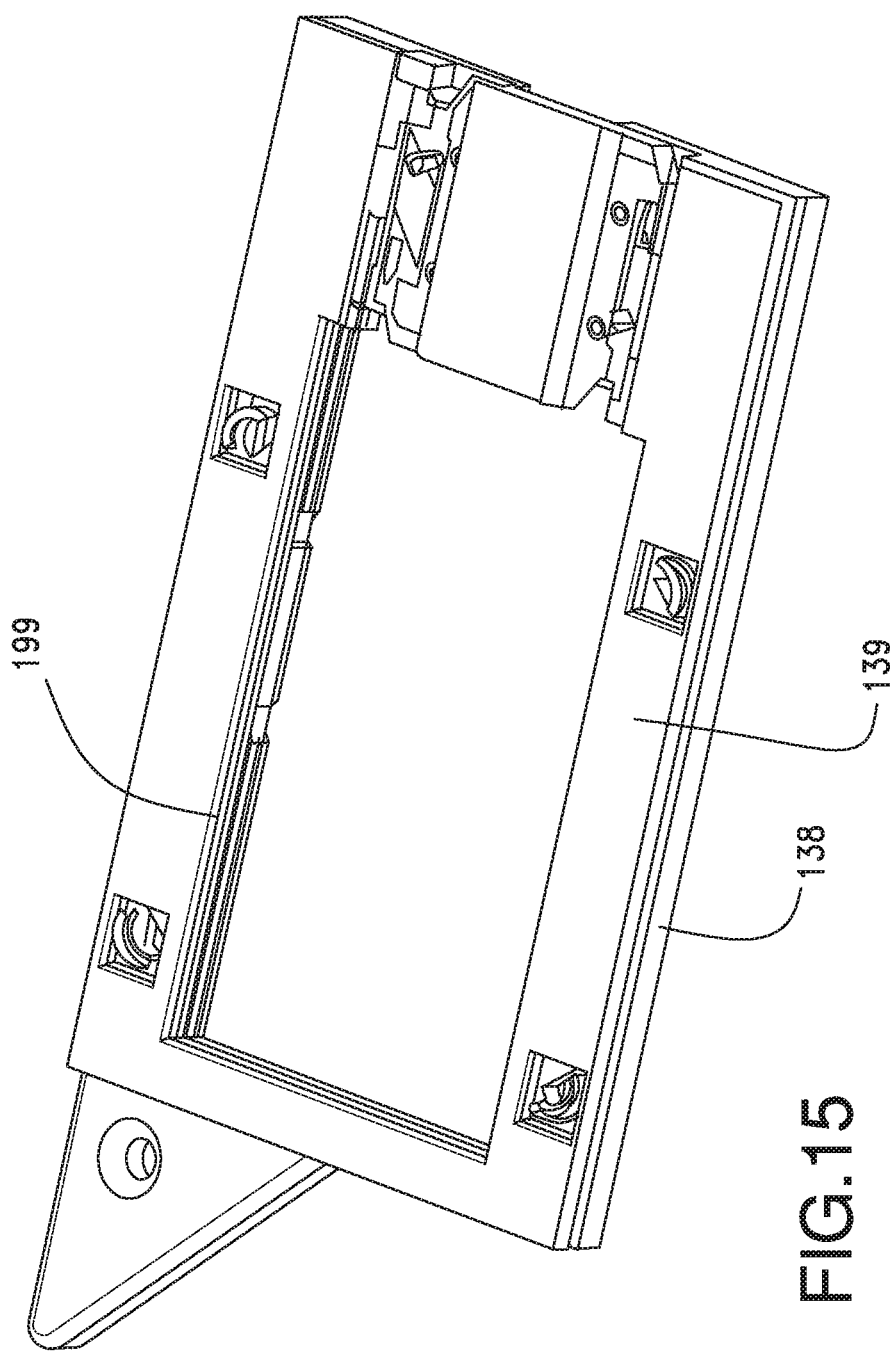
FIG. 15 is a perspective view of components of the power supply module.
Figure 16:
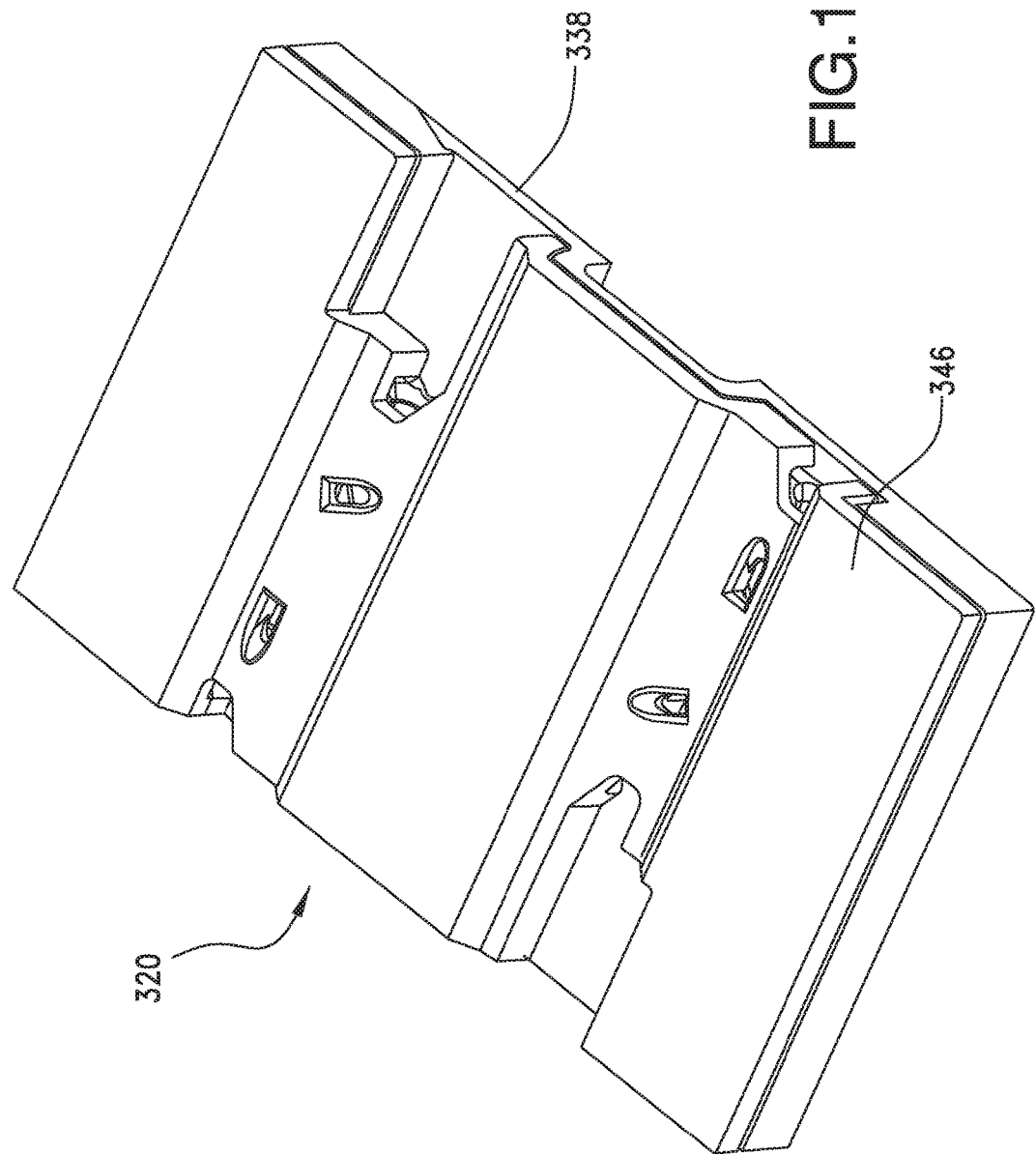
FIG. 16 is a perspective view of an embodiment of a jumper.
Figure 17:
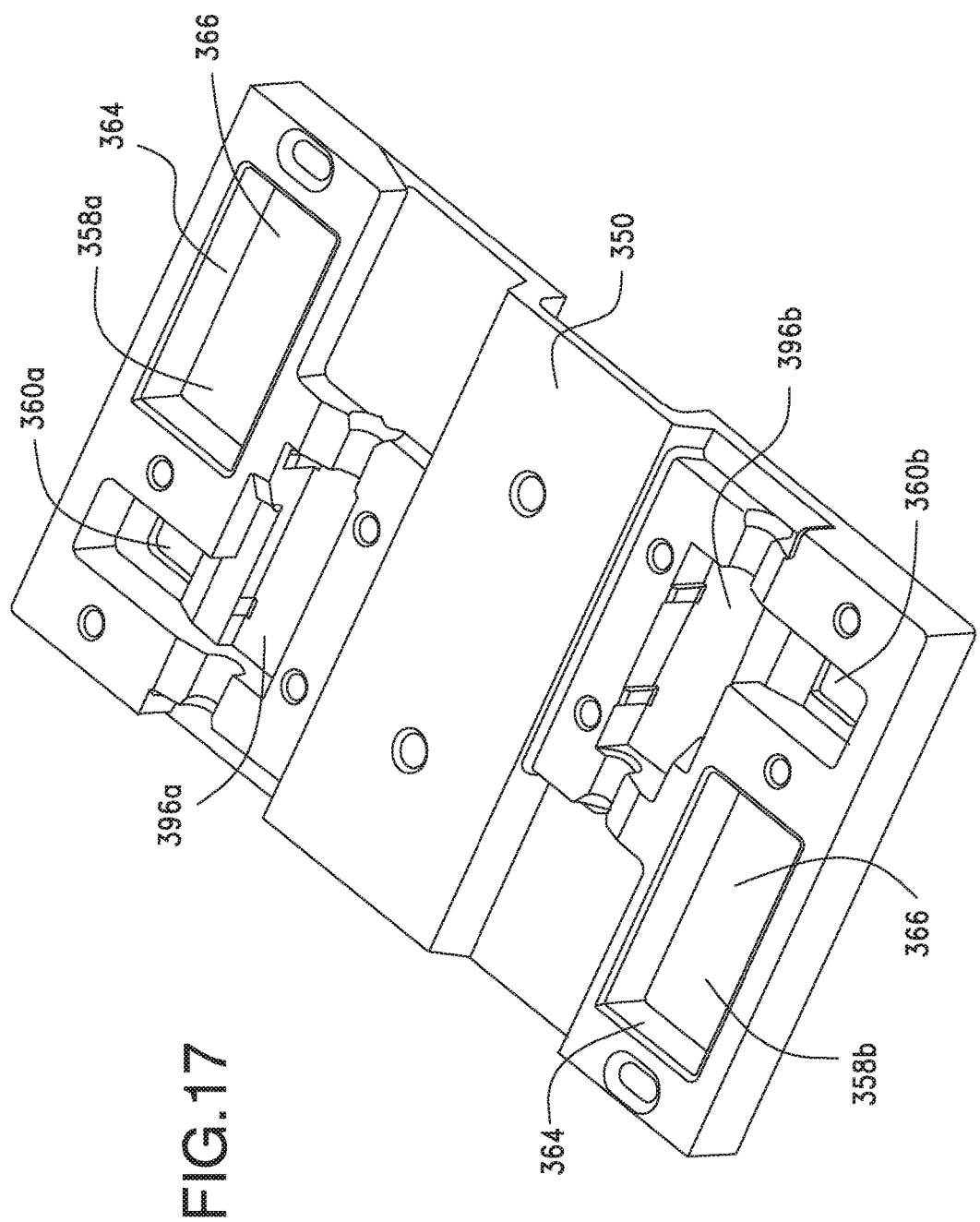
FIG. 17 is a perspective view of components of the jumper.
Figure 18:
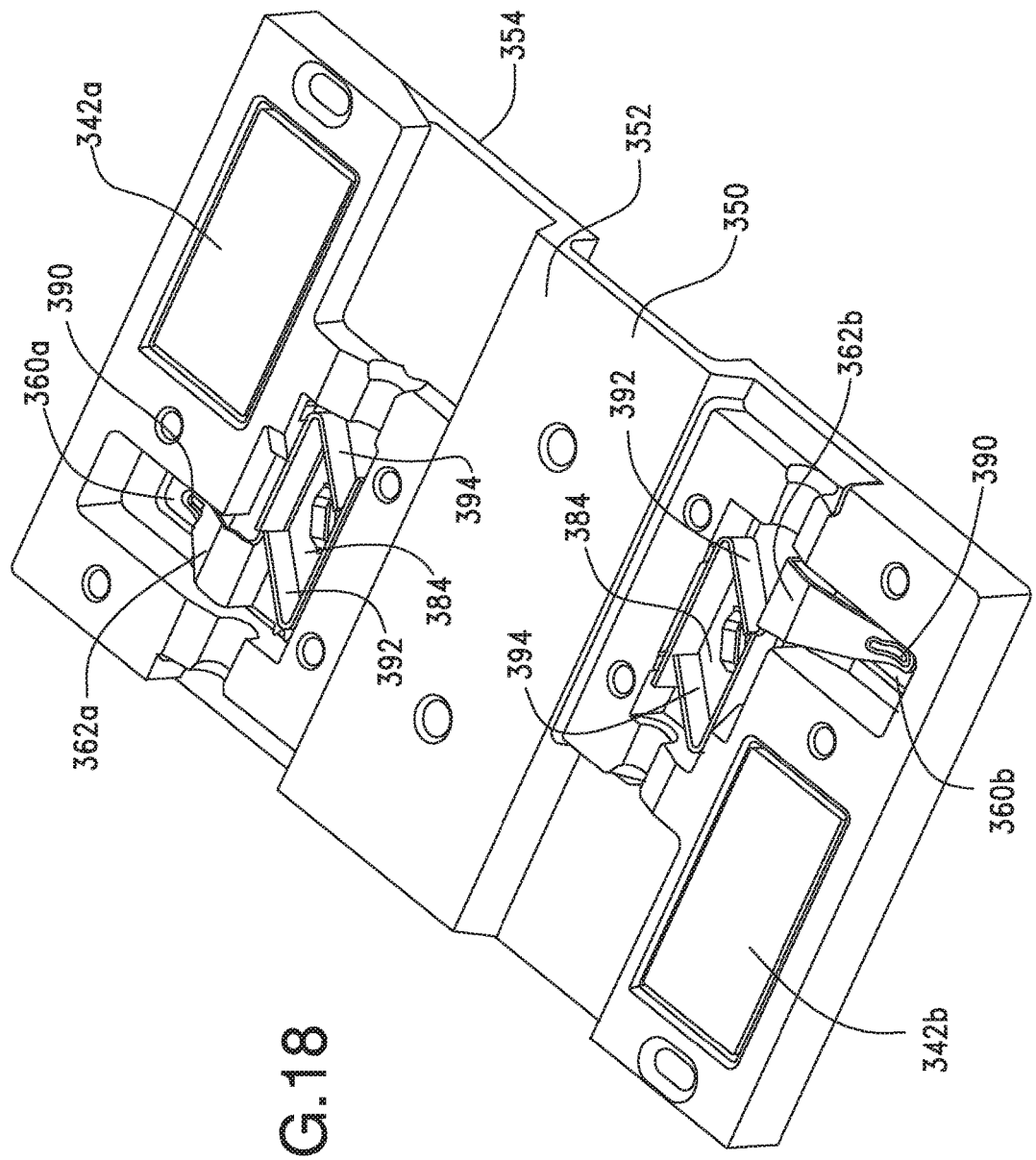
FIG. 18 is a perspective view of components of the jumper.

As can be appreciated from FIG. 14, each terminal 162a, 162b is formed of a conductive material and has a planar base 184, first, second and third portions 186, 188, 190 extending from the base 184, and a pair of wire traps 192, 194. The base 184 of each terminal 162a, 162b seats within a recess 196a, 196b in the interior surface 152 of the base wall 150 proximate to the respective terminal aperture 160a, 160b. The first portion 186 extends perpendicularly from the base 184. The second portion 186 extends from the respective first portion 186 and is angled relative to the respective first portion 186. The third portion 190 extends from the respective second portion 188 and is generally perpendicular to the respective first portion 186. Each third portion 190 is curved and extends through the respective terminal aperture 160a, 160b. The third portions 190 extend outwardly from the exterior surface 154. The second and third portions 188, 190 can flex relative to the first portion 186. Preferably, the second and third portions 188, 190 have at least a 0.4 mm tolerance for the flexure, as will be discussed in greater detail below. The wire traps 192, 194 are connected to wires or blades (not shown). The terminals 162a, 162b are electrically coupled to the power supply 140 via traces provided on or in the lower housing 138. Alternatively, the terminals could be coupled to the power supply via insulated conductors (e.g., insulated wires).

The upper housing 139 seats on the lower housing 138 and covers the magnets 142a, 142b and the terminals 162a, 162b. The upper housing 139 can include an aperture 199 therethrough to allow the power supply 140 to pass therethrough. When the upper housing 139 is seated on the lower housing 138, the magnets 142a, 142b are sandwiched between the lower and upper housings 138, 139. The cover 146 covers the lower and upper housings 138, 139 and is suitably attached thereto.

The power supply module 120 is placed on the support structure 22 such that the magnets 142a, 142b seat over the powered contacts 26, 28 of the rail 24. The magnetic attraction between the magnets 142a, 142b and the rail 24 provide a force that secures the power supply module 120 to the rail 24. The base walls 166 are sufficiently thin so as not to interfere with the magnetic force. Terminal 162a mates with powered contact 26; terminal 162b mates with powered contact 28. The second and third portions 188, 190 can flex within their tolerances relative to the first portions 186 upon engagement of the terminals 162a, 162b with the powered contacts 26, 28. This ensures a good electrical contact between the terminals 162a, 162b and the powered contacts 26, 28. As can be appreciated, during operation, current flows from power supply 140, along wires or traces connected to the contacts 162a, 162b, through the contacts 162a, 162b to the powered contacts 26, 28, and then to the energy consuming device 20.

As noted above, the terminals can flex through a range and as depicted can flex through a range of about 1 mm while still providing reliable electrical contact. While less tolerance is suitable for certain applications, it has been determined that greater than 0.5 mm and preferably greater than 0.8 mm of tolerance is beneficial to ensure good thermal contact is made between a support surface provide by the support structure (such as base wall 30). This is because when a compressible thermal bridge is used, it is beneficial to ensure the terminals engage the powered contacts but once a good electrical connection is made, the focus can shift to ensuring that thermal interface provided by the thermal bridge preferably is well managed. This may involve having some range of compression of the thermal bridge. By allowing the disclosed range of terminal flex while still providing good electrical contact it becomes much less problematic to try to manage the various tolerances while still ensuring that the thermal resistance is kept low (which is beneficial for devices that are intended to provide long life). This allows for a thermal bridge that can provide higher thermal conductivity while offering less compressibility.

The power supply module 120 can be easily moved around on the support structure 22 by a user pulling the power supply module 120 away from the support structure 22 to overcome the magnetic force. The power supply module 120 can then be easily repositioned on the support structure 22. Alternatively, the lower housing 138 and the cover 146 can include ears 200, 202 through which a fastener (not shown) can be provided to fixedly attach the power supply module 120 to the rail 24. If external ears such as depicted are used to secure the power supply module 120 to the support structure then the magnets can be omitted.

While the magnets 142a, 142b are shown as seating over the powered contacts 26, 28, it is to be understood that the magnets 142a, 142b can be provided on the lower housing 138 such that the magnets 142a, 142b seat over the rail 24 between the powered contacts 26, 28. However, for applications where the rail is not a ferrite-based material and the powered contacts are ferrite-based, positioning the magnets over the powered contacts is beneficial.

The jumper 320 is shown in FIGS. 14 and 16-18. The jumper 320 provides a means for connecting one support structure 22 to another support structure (not shown). The jumper 320 seats on the base wall 30 and on the powered contacts 26, 28. The jumper 320 includes a dielectric housing 338, a pair of magnets 342a, 342b supported in the housing 338, a pair of terminals 362a, 362b and a dielectric cover 346 attached to the housing 338 and covering the magnets 342a, 342b and the terminals 362a, 362b. The housing 338 includes a base wall 350, which may be planar in shape, having internal and external surfaces 352, 354, a magnet mount 358a, 358b provided on opposite sides of the base wall 350, and first and second terminal apertures 360a, 360b and their associated terminals 362a, 362b.

Magnet 342a seats in magnet mount 358a; magnet 342b seats in magnet mount 358b. As shown, magnets 342a, 342b can be rectangular in cross-section for the purposes of being easily manufactured; however, other shapes for the magnets 342a, 342b are also suitable. Each magnet mount 358a, 358b is formed as a recess extending from the interior surface 352. Each magnet mount 358a, 358b has side walls 364 extending from the interior surface 352 and a planar base wall 366. Each magnet mount 358a, 358b preferably conforms to the shape of the magnet 342a, 342b, and the magnets 342a, 342 may extend from the interior surface 352 of the housing 338, or may be flush with the interior surface 352 of the housing 338.

Terminal aperture 360a is proximate to, but spaced from, magnet mount 358a; terminal aperture 360b is proximate to, but spaced from, magnet mount 358b. Terminal aperture 360a is adjacent to one side edge of the base wall 350, while terminal aperture 360a is adjacent to the opposite side edge of the base wall 350. Each terminal aperture 360a, 360b extends through the base wall 350, from the interior surface 352 to the exterior surface 354.

The terminals 362a, 362b can be identical in structure to those shown in FIG. 14 and therefore the specifics are not repeated herein. The base 384 of each terminal 362a, 362b seats within a recess 396a, 396b in the interior surface 352 of the base wall 350 proximate to the respective terminal aperture 360a, 360b. Each third portion 390 extends through the respective terminal aperture 360a, 360b and extends outwardly from the exterior surface 354. The wire traps 392, 394 are connected to wires or blades (not shown) to connect to the power supply module 120 or wire/blades extending from the adjoining energy consuming device 20.

The cover 346 seats on and is suitably attached to the housing 338. The cover 346 covers the magnets 342a, 342b and the terminals 362a, 362b. When the cover 346 is seated on the housing 338, the magnets 342a, 342b are sandwiched between the cover 346 and the housing 338.

The jumper 320 is placed on the support structure 22 such that the magnets 342a, 342b seat over the powered contacts 26, 28 of the rail 24. The magnetic attraction between the magnets 342a, 342b and the rail 24 provide a force that secures the jumper 320 to the rail 24. The base walls 366 are sufficiently thin so as not to interfere with the magnetic force. Terminal 362a mates with powered contact 26; terminal 362b mates with powered contact 28. The terminals 362a, 362b can flex within their tolerances upon engagement of the terminals 362a, 362b with the powered contacts 26, 28. This ensures a good electrical contact between the terminals 362a, 362b and the powered contacts 26, 28. In practice, two jumpers 320 can be used to electrically power two adjacent rails 24. During operation, current flows from power supply 140, to the terminals 162a, 162b, along power contacts 26, 28 of a first rail, through the terminals 362a, 362b of a first jumper 320, along wires or blades connected between the wire traps 192/392, 194/394, through terminals 362a, 362b of a second jumper to the powered contacts 26, 28 of the second rail 24 (and then to any energy consuming devices mounted on the second rail).

The jumper 320 can be easily attached or detached from the support structure 22 by a user pulling the jumper 320 away from the support structure 22 to overcome the magnetic force. While the magnets 342a, 342b are shown as being positioned over the powered contacts 26, 28, it is to be understood that the magnets 342a, 342b can be provided on the lower housing 338 such that the magnets 342a, 342b are positioned over the base wall 30 of the rail 24 (e.g., between the powered contacts 26, 28).

As can be appreciated, the energy consuming device 20, the power supply module 120, the jumper 320 and the support structure 22 are configured to provide a low profile system. This is beneficial in many situations, such as where the space is shallow. In that regard, having a flat base wall and fins that extend away from the base wall at least more than twice the distance that the power contacts extend from the base wall along with the small, relatively compact energy consuming device provides a clean, elegant ornamental look that has been determined to be desirable and feasible with the embodiments disclosed. The look can be more desirable if the fins extend more than twice as high above the base wall as the power contacts and it is more preferably if the fins extend more than four times as high as the power contacts. In addition, the top of the energy consuming device can extend at least five times the height of the power contacts while engaging the base between the power contacts with the thermal bridge. For example, if the power contacts extend about 0.6 mm above the base wall, the top of the energy consuming device can be between 6.0 mm and 10 mm above the base wall (e.g., more than 5 times the height but less than 20 times the height so as to provide a beneficial aesthetic appearance).

Figure 19:
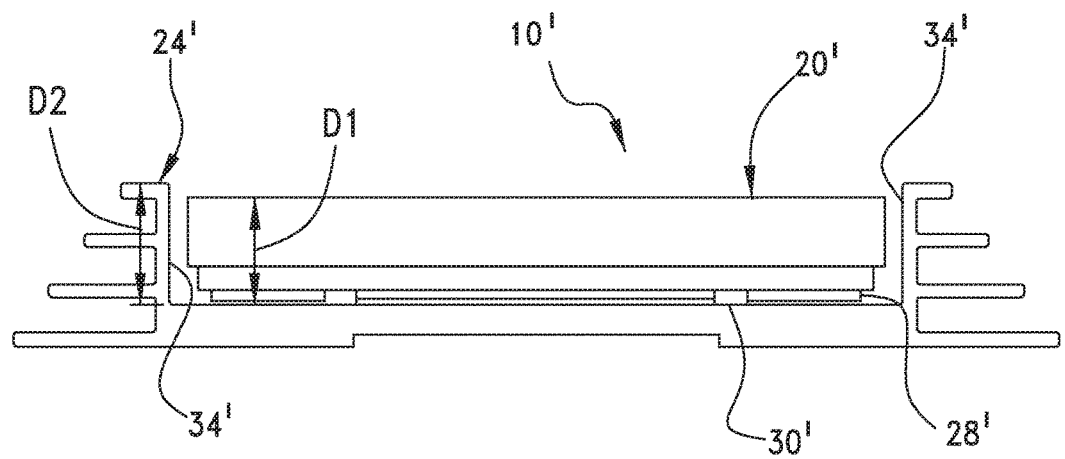
FIG. 19 is an elevated side view of an embodiment of a rail and energy consumption device.
Figure 20:
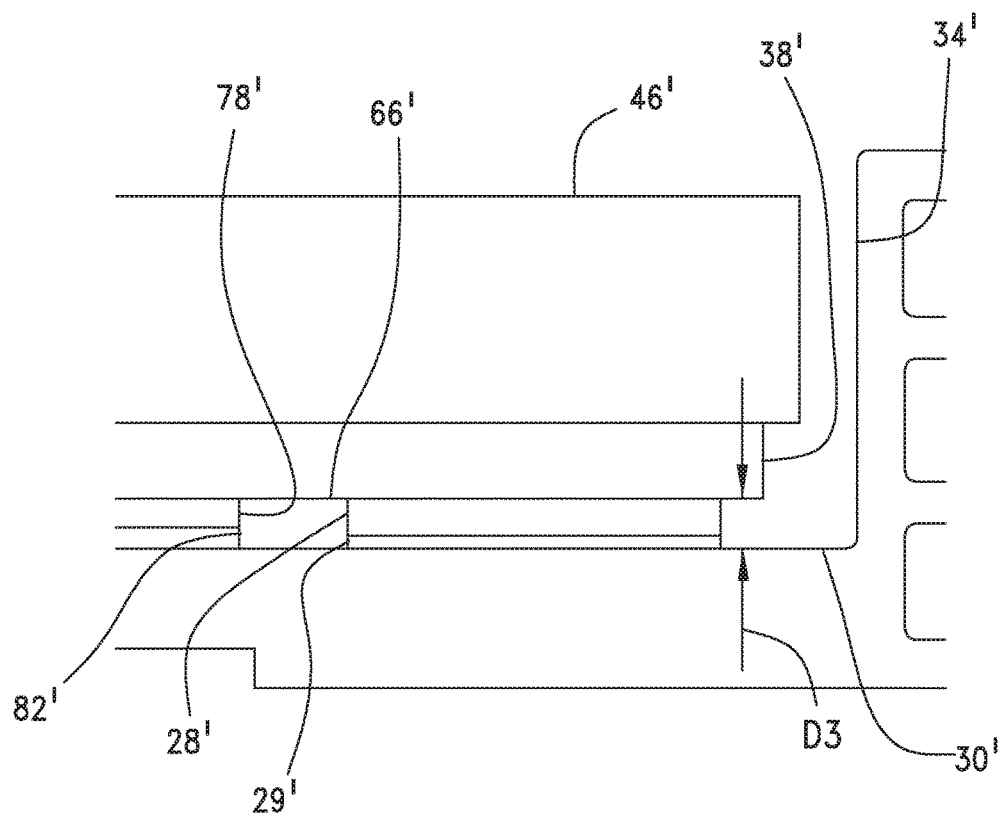
FIG. 20 is an enlarged view of the embodiment depicted in FIG. 19.

For example, looking at FIGS. 19 and 20, a system 10' is disclosed that includes an energy consumption device 20 mounted to a rail 24'. As can be appreciated, the energy consumption device 20', when installed, extends a height D1 above a base wall 30' and the rail 24' has fins 34' that extend a distance D2 above the base wall 30'. In certain embodiments, D2 will be at greater than ½ D1 and as depicted, D2 is greater than D1.

As can be appreciated, interface wall 66' of housing 38' is positioned on powered contact 28' so that plate 78' compressed thermal bridge 82' between the plate 78' and the base wall 30'. Furthermore, the distance the power contact extends above the base wall 30 can be kept short, so that for an attractive, elegant look the distance D2 is at least 3 times distance D3 and preferably D2 is more than 10 times D3. The appearance of the design may be important in locations where the assembly is visible, particularly in commercial settings where the appearance of the resultant embodiment can affect the behavior of those that see the design.

While exemplary embodiments are shown and described herein, it is envisioned that those skilled in the art may devise various modifications without departing from the spirit and scope of the appended claims.

The invention claimed is:

1. An energy consuming device, comprising:
   a housing with lower surface, an aperture in the lower surface, at least one magnetic mount and a first and second terminal aperture;
   a first and second terminal respectively position in the first and second terminal aperture so that a portion of the first and second terminal extend below the lower surface;
   a light emitting diode (LED) array positioned on a plate and positioned in the aperture and electrically coupled to the first and second terminal, the plate including a thermal bridge that is configured to extend below the lower surface;
   a magnet positioned in the magnetic mount, wherein the magnet is configured to cause the thermal bridge to be compressed when the device is mounted in a rail; and
   a cover mounted to the housing, the cover extending over the magnet so as to occlude the magnet.

2. The energy consuming device of claim 1, wherein the thermal bridge is configured to extend below the lower surface a distance of at least 0.6 mm and the magnet is in a first magnet position in a first magnet mount, the energy consumption device including a second magnet mounted in a second magnet mount, the first and second magnet being aligned with and electrically separated from powered contacts of the rail.

3. The energy consuming device of claim 2, wherein the cover and the housing cooperatively provide an internal volume and the first and second terminal are positioned in the terminal apertures such that dust entering into the terminal apertures is sealed from entering into the internal volume.

4. The energy consuming device of claim 1 included within an illumination system, the illumination system comprising:
   a rail with a base wall and a first and second power contact,
   wherein the energy consuming device is mounted on the rail and the thermal bridge is pressed against the base wall between the first and second powered contact.

5. The illumination system of claim 4, wherein the first and second terminal respectively contact the first and second power contact and the thermal bridge is configured to press against the base wall with a force sufficient to provide at least 3 PSI.

6. An energy consumption system, comprising:
   a rail having a base and two walls that extend above the base a first distance, the base supporting two power contacts spaced apart in a parallel configuration, the power contacts electrically isolated from the rail and extending above the base a second distance, the first distance being at least five times the second distance; and
   an energy consumption device mounted on the rail, the energy consumption device having a thermal bridge configured to engage the base between the two power contacts and having at least one magnet that urges the energy consumption device toward the rail such that the thermal bridge is under a compressive force.

7. The energy consumption system of claim 6, wherein the power consumption device extends a third distance above the base, the third distance being at least five times the second distance.

8. The energy consumption system of claim 7, wherein the first distance and third distance are both at least ten times the second distance.

9. The energy consumption system of claim 8, wherein the second distance is less than 1 mm.

10. The energy consumption system of claim 6, further comprising a power supply.

11. The energy consumption system of claim 10, wherein the power supply is coupled via magnetic force to the rail.

12. The energy consumption system of claim 6, wherein the energy consumption device is a light emitting diode (LED) module configured to emit light.

13. The energy consumption system of claim 12, wherein the two walls are less than 60 mm apart and the first distance is at least ten times the second distance.

14. The energy consumption system of claim 13, wherein the LED module provides at least 250 lumens.

15. The energy consumption system of claim 14, wherein the LED module extends a third distance above the base and the third distance is less than 20 times the second distance.

16. The energy consumption system of claim 15, wherein the first distance is less than 20 times the second distance.

17. The energy consumption system of claim 16, wherein the second distance is less than 1 mm.

18. An energy consumption system, comprising:
   a rail having a base and two walls that extend above the base a first distance, the base supporting two power contacts spaced apart in a parallel configuration, the power contacts electrically isolated from the rail and extending above the base a second distance, the first distance being at least five times the second distance; and
   an energy consumption device mounted on the rail, the energy consumption device including a first terminal that engages one of the two power contacts and a second terminal that engages the other of the two power contacts, the energy consumption device having a thermal bridge configured to engage the base between the two power contacts and having at least one magnet that urges the energy consumption device toward the rail such that the thermal bridge is compressed by the force exerted by the magnet and the first and second terminals are deflected by the force exerted by the magnet.

19. The energy consumption system of claim 18, further comprising a power supply separate from the energy consumption device, the power supply providing power to the power contacts.

20. The energy consumption system of claim 19, wherein the power supply is coupled via magnetic force to the rail.

\* \* \* \* \*